(12) United States Patent
Lin et al.

(10) Patent No.: US 6,355,527 B1
(45) Date of Patent: Mar. 12, 2002

(54) METHOD TO INCREASE COUPLING RATIO OF SOURCE TO FLOATING GATE IN SPLIT-GATE FLASH

(75) Inventors: Yai-Fen Lin, Non-Tour; Chia-Ta Hsieh, Tainan; Hung-Cheng Sung, Hsin-Chu; Jack Yeh, Chu-Pei; Di-Son Kuo, Hsin-chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/314,588

(22) Filed: May 19, 1999

(51) Int. Cl.[7] .............................................. H01L 21/336
(52) U.S. Cl. ........................ 438/265; 438/279; 438/283; 438/303
(58) Field of Search ................................. 438/266, 260, 438/258, 283, 257–267, 279, 303; 257/314–326

(56) References Cited

U.S. PATENT DOCUMENTS

| | | | |
|---|---|---|---|
| 4,861,730 A | | 8/1989 | Hsia et al. .................... 437/43 |
| 5,349,220 A | | 9/1994 | Hong .......................... 257/322 |
| 5,393,686 A | * | 2/1995 | Yeh et al. .................... 437/45 |
| 5,412,238 A | | 5/1995 | Chang .......................... 257/321 |
| 5,480,821 A | | 1/1996 | Chang .......................... 437/43 |
| 5,597,751 A | * | 1/1997 | Wang ........................... 437/43 |
| 5,652,161 A | * | 7/1997 | Ahn ............................. 437/43 |
| 5,679,589 A | * | 10/1997 | Lee et al. .................... 437/40 |
| 5,702,965 A | | 12/1997 | Kim ............................ 47/43 |
| 5,872,036 A | * | 2/1999 | Sheu ........................... 438/266 |
| 5,895,223 A | * | 4/1999 | Peng et al. .................... 438/18 |
| 5,915,178 A | * | 6/1999 | Chiang et al. ............... 438/266 |
| 5,940,706 A | * | 8/1999 | Sung et al. .................. 438/261 |
| 5,950,087 A | * | 9/1999 | Hsieh et al. ................. 438/264 |
| 5,972,753 A | * | 10/1999 | Lin et al. .................... 438/264 |
| 6,017,795 A | * | 1/2000 | Hsieh et al. ................. 438/262 |

* cited by examiner

*Primary Examiner*—Howard Weiss
*Assistant Examiner*—Marcos D. Pizarro-Crespo
(74) *Attorney, Agent, or Firm*—George O. Saile; Stephen B. Ackerman; Sergin Oktay

(57) ABSTRACT

A method is provided for forming a split-gate flash memory cell having reduced size, increased coupling ratio and improved program speed. A split-gate cell is also provided where the a first polysilicon layer forms the floating gate disposed over an intervening intergate oxide formed over a second polysilicon layer forming the control gate. However, the second polysilicon layer is also formed over the source region and overlying the other otherwise exposed portion of the floating gate such that this additional poly line now shares the voltage between the source and the floating gate, thereby reducing punch-through and junction breakdown voltages. In addition, the presence of another poly wall along the floating gate increases the coupling ratio between the source and the floating gate, which in turn improves program speed of the split-gate flash memory cell.

21 Claims, 3 Drawing Sheets

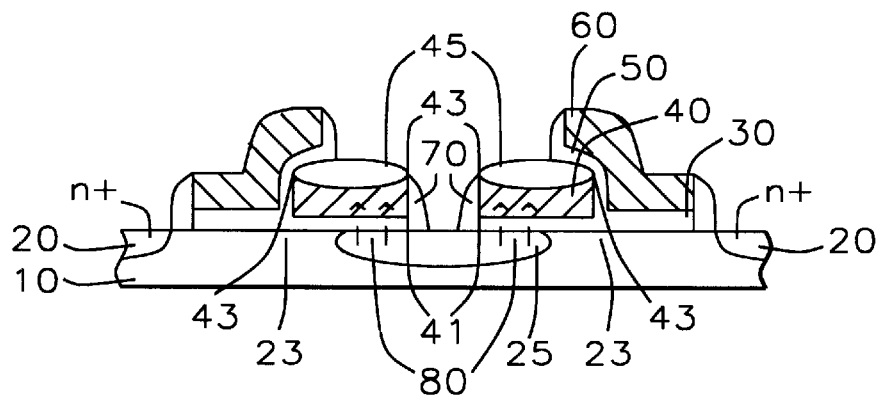
FIG. 1A – Prior Art
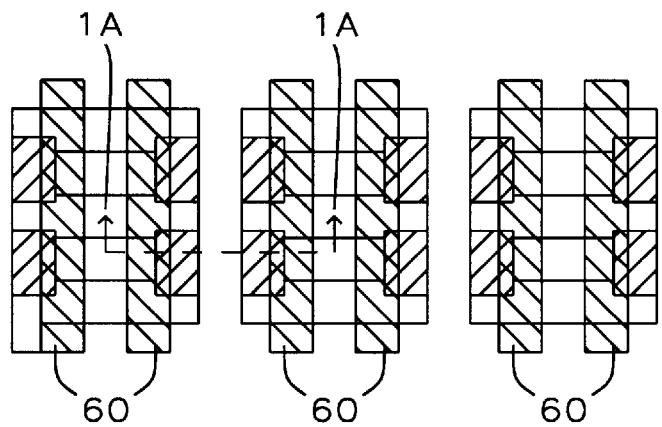
FIG. 1B – Prior Art
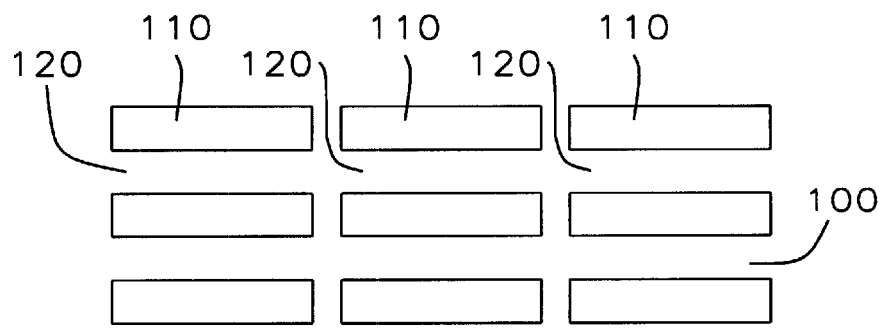
FIG. 2A

METHOD TO INCREASE COUPLING RATIO OF SOURCE TO FLOATING GATE IN SPLIT-GATE FLASH

BACKGROUND OF THE INVENTION (1) Field of the Invention

The present invention relates to semiconductor devices and more particularly to a method of forming a split-gate flash memory cell in order to reduce the size of the cell and at the same time increase the coupling ratio between the floating gate and the source for improved program speed.

(2) Description of the Related Art

A conventional split-gate flash memory device is characterized by its split-gate side (between the control gate and the drain) and the stacked-side (between the floating gate and the source) and by a coupling ratio between the floating gate and the source. As is known, the coupling ratio affects the program speed, that is, the larger the coupling ratio, the faster is the programming speed, and is not a fixed value by virtue of the variability of the channel length and hence that of the overlap between the floating gate and the source. Usually, if channel length is increased through greater lateral diffusion in the source region, punchthrough occurs due to excessive current well below the threshold voltage. It is shown in the present invention that the coupling ratio can be increased without increasing the channel length, but by incorporating side-wall coupling of poly on source line and, at the same time, alleviating the punchthrough and junction break-down of source region by sharing gate voltage with the poly on source line.

Over the years, numerous improvements in the performance as well as in the size of memory devices have been made by varying the simple, basic one-transistor memory cell, which contains one transistor and one capacitor. The variations consist of different methods of forming capacitors, with single, double or triple layers of polysilicon, and different materials for the word and bit lines. In general, memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Most conventional flash-EEPROM cells use a double-polysilicon (poly) structure of which the well known split-gate cell is shown in FIG. 1A. Here, two MOS transistors share a source (25). Each transistor is formed on a semiconductor substrate (10) having a first doped region (20), a second doped region (25), a channel region (23), a gate oxide (30), a floating gate (40), intergate dielectric layer (50) and control gate (60). Substrate (10) and channel region (23) have a first conductivity type, and the first (20) and second (25) doped regions have a second conductivity type that is opposite the first conductivity type.

As seen in FIG. 1A, the first doped region, (20), lies within the substrate. The second doped region, (25), also lies within substrate (10) and is spaced apart form the first doped region (20). Channel region (23) lies within substrate (10) and between first (20) and second (25) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In the structure shown in FIG. 1A, control gate (60) overlaps the channel region, (23 under the floating gate, (40). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (23) determines the cell performance. Furthermore, edges (41), (43) can affect the programming of the cell by the source size and hot electron injection through the intergate dielectric layer (50) at such edges. Hot electron injection is further affected by, what is called, gate bird's beak (43) that is formed in conventional cells. On the other hand, it will be known to those skilled in the art that corners such as (41) can affect the source coupling ratio also. Any such adverse effects attributable to the source size can be alleviated as disclosed later in the embodiments of this invention.

To program the transistor shown in FIG. 1A, charge is transferred from substrate (10) through gate oxide (30) and is stored on floating gate (40) of the transistor. The amount of charge is set to one of two levels to indicate whether the cell has been programmed "on" or "off." "Reading" of the cell's state is accomplished by applying appropriate voltages to the cell source (25) and drain (20), and to control gate (60), and then sensing the amount of charge on floating gate (40). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of importance in the tunneling region is the quality and the thinness of the tunneling oxide separating the floating gate from the substrate.

In the conventional memory cell shown in FIG. 1A, word lines (not shown) are connected to control gate (60) of the MOS transistor, while the length of the MOS transistor itself is defined by the source (25) drain (20) n+ regions shown in the same Figure. As is well known by those skilled in the art, the transistor channel is defined by masking the n+ regions. However, the channel length of the transistor varies depending upon the alignment of the floating gate (40) with the source and drain regions. This introduces significant variations in cell performance from die to die and from wafer to wafer. Furthermore, the uncertainty in the final position of the n+ regions causes variations in the series resistance of the bit lines connected to those regions, and hence additional variation in the cell performance.

Prior art contains different methods for fabricating different split-gate memory cells. In U.S. Pat. No. 5,480,821 by Chang, a method of fabricating source-coupling, split-gate, virtual ground flash EEPROM array is proposed, while in U.S. Pat. No. 5,412,238 by the same inventor a structure of the same split-gate memory cell is shown. The floating gate of each cell is formed over a first portion of the substrate channel region and is separated from the channel region by a layer of floating gate oxide. Each floating gate includes a tunneling arm that extends over the cell's source line and is separated therefrom by thin tunnel oxide. A word line is formed over the floating gates of the storage cells in each row of the array. The word line is separated from the underlying floating gate by a layer of oxide/nitride/oxide (ONO). The word lines run perpendicular to the buried n+ bit lines and extend over a second portion of the channel region of each cell in the row to define the internal access transistor of the cell. The word line is separated from the second portion of the channel region by the ONO layer.

Operation of a flash memory cell is taught by Hong in U.S. Pat. No. 5,349,220 where a semiconductor device is formed on a substrate lightly doped with a dopant. A source region and a drain region are formed in the substrate on the surface thereof. A dielectric layer is deposited upon the substrate. A floating gate electrode is formed on the dielectric layer proximate to at least the edges of these source region and the drain region. Additional dielectric material is deposited on the surface of the floating gate electrode, and a gate electrode is deposited upon the surface of the additional dielectric material.

A different flash memory cell and a method of forming the same are proposed by Kim in U.S. Pat. No. 5,702,965. According to Kim, program and erasure capabilities of the cell can be improved by forming an insulation spacer of an ONO or ON structure formed at the sidewalls of the floating gate. This structure also prevents the reduction of the coupling ratio and leakage electrons through the floating gate and the control gate. Still another process for making a high density split gate nonvolatile memory cell is described by Hsia, et al., in U.S. Pat. No. 4,861,730 where the drain region is self-aligned to the floating gate and the source region is self-aligned to the control gate. Fully self-aligned implantation is made possible by the process and structure using self-aligned etch.

While prior art offers different approaches for forming different split-gate flash memory cells, none of the cited methods show methods of increasing coupling ratio by employing a sidewall coupling that is claimed later in the embodiments of this invention, nor do they address the problem of punchthrough or junction break-down when increase in coupling ratio is attempted by increasing the size of the source region. It is well-known in the prior art that, as shown in FIG. 1B, of which FIG. 1A is a cross-section, the injection of carriers (80) into the floating gate (40) through edge (41) with voltage across source (25) and floating gate (40) can cause punch-through and junction break-down. The present invention makes possible to share the voltages with an additional poly line over the source region so that not only the excessive voltage levels are reduced, but at the same time the coupling ratio is increased with increased vertical area, but without increasing the lateral dimensions of the split-gate flash memory cell.

SUMMARY OF THE INVENTION

It is therefore an object of this invention to provide a method of forming split-gate flash memories with improved program speed.

It is another object of this invention to provide a method of forming split-gate flash memories with increased capacitive coupling between the source and the floating gate of the memory cell.

It is yet another object of the present invention to provide a method of forming split-gate flash memories with reduced punch-through and junction break-down attributes.

It is still another object of this invention to provide a split-gate flash memory cell having reduced size, increased capacitive coupling and improved program speed.

These objects are accomplished by providing a silicon substrate having a plurality of active and field areas defined; forming a gate oxide layer over said substrate; forming a first polysilicon layer over said [first] gate oxide layer; forming a nitride layer over said first polysilicon layer; forming a first photoresist layer over said nitride layer; patterning said first photoresist layer to define cell area and a floating gate[s]; etching said nitride layer through [said patterning in] said first photoresist layer and forming openings in said nitride layer reaching said first polysilicon layer; removing said first photoresist layer from said substrate; performing thermal oxidation of said first polysilicon layer exposed in said openings reaching said first polysilicon layer to form regions of poly-oxide; removing said nitride layer; etching said first polysilicon layer to form said floating gate using said regions of poly-oxide as a hard mask; then forming a second photoresist layer over said substrate and patterning to define source region; then performing ion implantation through openings in said second [patterned] photoresist layer to form a source region within said substrate; then removing said second photoresist layer; growing intergate oxide layer over said first polysilicon layer; forming second polysilicon layer over said intergate oxide layer; patterning said second polysilicon layer to form a control gate over said floating gate and [a] an additional third polysilicon line (poly-line) continuous over said source region; forming oxide spacers on sidewalls of said control gate and on sidewalls of said polyline; and performing ion implantation to form drain regions defined by said oxide spacers.

These objects are further accomplished by providing memory cell having an additional poly line with an extended vertical wall to share the voltage levels between the source and the floating gate in order to reduce punch-through and junction break-down and thereby to increase the coupling ratio and hence the program speed of the split-gate flash memory cell.

BRIEF DESCRIPTION OF THE DRAWINGS

FIG. 1A shows a cross-sectional view of a split-gate type memory cell of prior art.

FIG. 1B shows a top view of the split-gate memory cell of prior art of FIG. 1A.

FIG. 2A shows the top view of the forming of the passive and active regions of the semiconductor substrate of this invention.

DESCRIPTION OF THE PREFERRED EMBODIMENTS

Figure 2B:
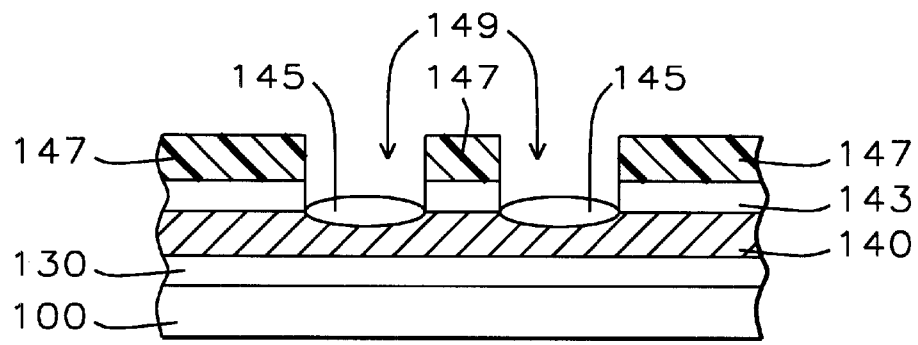
FIG. 2B shows the cross-sectional view of the substrate of FIG. 2A after the forming of gate oxide layer, first polysilicon layer, nitride layer, phtoresist layer and the patterning of the latter two layers, according to this invention.

Referring now to the drawings, specifically to FIGS. 2A–2G, there is shown a method of forming a split gate flash memory cell with an additional poly line in order to increase the coupling ratio and improve program speed while at the same time keeping the same memory cell size. In FIG. 2A, substrate (100), preferably silicon, is provided with passive field regions (110), and active device regions (120) already defined as is well known in the art. A cross-section of substrate (100) is also shown in FIG. 2B. A gate oxide layer (130) of thickness between about 70 to 120 angstroms (Å) is first formed on substrate (100). Gate oxide (130) can be formed by thermal oxidation process at a temperature between about 850° C. to 950° C. Alternatively, the gate oxide can be formed by an atmospheric or low pressure chemical vapor deposition (LPCVD) process as is well known.

Next, a first polysilicon layer (140) is formed over the gate oxide layer (130) as shown in FIG. 2B. This is accomplished through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 550 to 650° C. The preferred thickness of the first polysilicon layer is between about 1100 to 1200 angstroms (Å). This is followed by the deposition of nitride layer (143) using dichlorosilane ($SiCl_2H_2$) with ammonia ($NH_3$) in an LPCVD at a pressure between about 0.25 to 1.0 torr, temperature between about 750 to 850° C. and at flow rates between about 80 to 120 sccm. The preferred thickness of the nitride layer is between about 500 to 1500 Å.

Figure 2C:
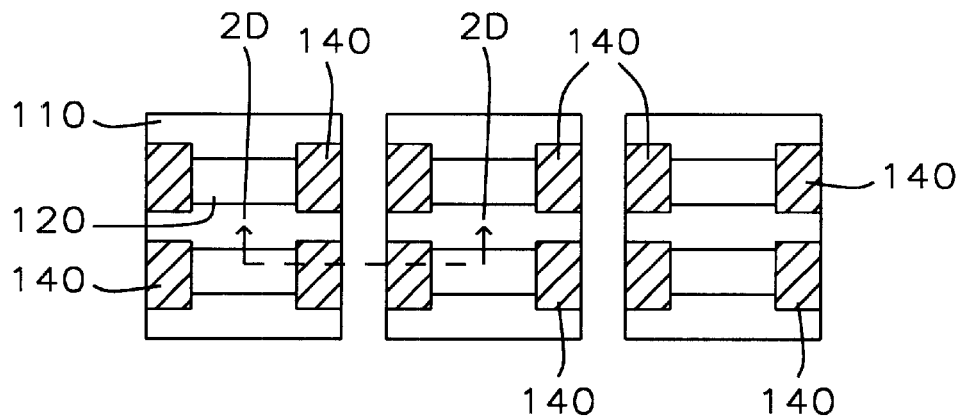
FIGS. 2C shows a top view of the substrate of FIG. 2B after the forming of the floating gates, according to this invention.
Figure 2D:
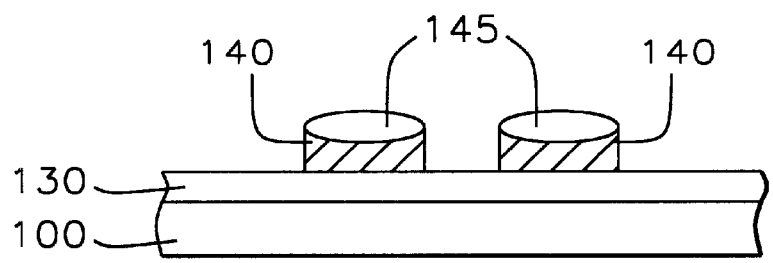
FIG. 2D shows a cross-sectional view of the floating gates of FIG. 2C, according to this invention.

A first photoresist layer, (147), is next formed and patterned to define the floating gate regions over the substrate as shown in FIG. 2B. The pattern openings, (149), are dry etched into the nitride layer until the underlying polysilicon layer (140) is exposed. The etching of nitride layer is accomplished with etch recipe comprising gases Ar, $CHF_3$ and $C_4F_8$. Subsequently, photoresist layer (147) is removed, and using patterned nitride layer (143), the exposed portions of first polysilicon layer (140) are oxidized. That is, the exposed first polysilicon layer in the floating gate pattern openings in the nitride layer are oxidized in a wet environment and at a temperature between about 850 to 950° C. to form poly-oxide "caps" (145) shown in FIG. 2D, with a preferred thickness between about 1400 to 1500 Å. After the poly oxidation, the nitride layer is removed by applying a wet solution of phosphoric acid, $H_3PO_4$. Using the poly-oxide layer as a hard mask, the first polysilicon layer is etched using a recipe comprising HBr, $Cl_2$, He and $O_2$ gases thus forming polysilicon floating gates (140) as shown in FIG. 2D. A top view of substrate (100) is shown in FIG. 2C, which also shows where the cross-section 2D is taken.

It will be known to those skilled in the art that conventionally, after the forming of the first polysilicon floating gate (40), an intergate oxide is grown (50), as was shown in FIG. 1A, followed by the forming of a second polysilicon layer which is then patterned to form a control gate (60). Then, a [first] second photoresist layer is used to define source (25), and source implantations is performed. Finally, oxide spacers (70) are formed along the vertical walls of control gates (60), as shown in FIG. 1A, and implantation is performed to form drains (20).

Figure 2E:
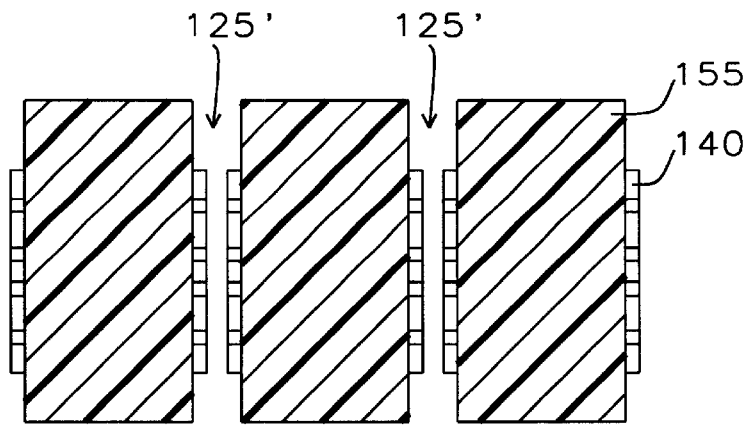
FIG. 2E shows the top view of FIG. 2D after the forming of a first photoresist layer in defining the source regions of the substrate of this invention.
Figure 2F:
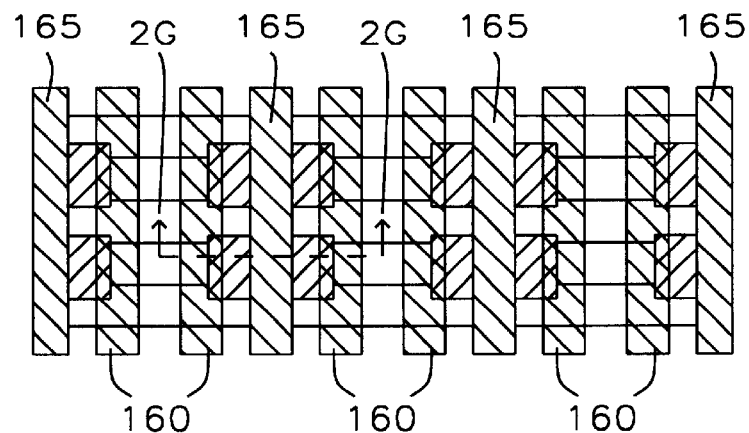
FIG. 2F shows the top view of the substrate of FIG. 2E after the forming of the second polysilicon layer which is to be formed into control gates as well as into additional poly lines disposed over source regions, according to this invention.

In the present invention, however, source implantation is performed after the forming of the floating gate (140) as shown in FIG. 2E. This is accomplished, first, by forming a [first] second photoresist layer (155) over the substrate and defining and implanting the cell source areas (125') as shown in the top view of the substrate in FIG. 2E. Subsequently, the photoresist layer is removed, an intergate oxide grown, a second polysilicon layer is deposited to from a control gate, and at the same time to form an additional poly line over the source region (125'). Thus, as seen in FIG. 2F, and as a main feature and key aspect of the present invention, third poly lines (165) are formed at the same time the control gates (160) are formed from the same second polysilicon layer (160). Furthermore, third poly lines (165) extend over the source regions (125) of the split-gate flash memory cell better seen in cross-sectional view in FIG. 2G.

Source implantation is accomplished, preferably, by using phosphorous ions with a dosage between about $1\times10^{15}$ to $1\times10^{16}$ atoms/cm$^2$ and at an energy between about 20 to 90 KeV. The photoresist layer is then removed, and intergate oxide layer (150) is grown to a thickness between about 200 to 300 Å. It is preferred that the intergate oxide is an oxynitride film formed by the nitridization of a thermal oxide layer by thermally annealing the oxide layer with dilute $NH_3$ using $N_2$ or Ar as a carrier gas at an elevated temperature; e.g., greater than 800° C. The main feature of the invention, namely, the depositing of the second polysilicon layer is accomplished in a manner so as to form not only the control gates (160) disposed over floating gates (140) with an intervening intergate oxide layer (150), but also to form poly lines (165) continuous over the source regions (125') as shown both in FIGS. 2E and 2F, as well as in FIG. 2G. The second polysilicon layer is also preferably formed through a LPCVD method employing silane $SiH_4$ as a silicon source material at a temperature range between about 550 to 620° C. The preferred thickness is between about 1500 to 2500 Å. It will be noted in FIG. 2G that the poly line (165) provides an additional vertical wall area along the edges of the floating gates (140). The additional area shares the voltage levels imposed between source (125) and the floating gate (140), thereby reducing the possibility for punch-through and junction break-down. It will also be appreciated by those skilled in the art that, by virtue of the increase of sidewall coupling area between the source and the floating gate, the coupling ratio is also increased with the result of improved program speed for the memory cell. Furthermore, it is seen in the same figure that the transport of carriers (180) is enhanced by the increase in the area along the edges (141) and (143) of floating gates (140).

Figure 2G:
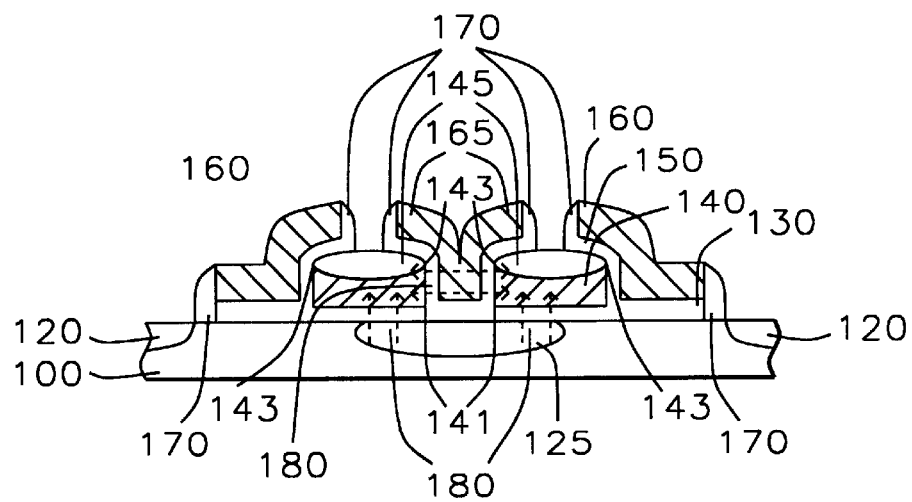
FIG. 2G is a cross-sectional view of the substrate of FIG. 2F showing the additional poly line over the source region of this invention, as well as the coupled sidewall of the additional poly line where the voltages are further shared between the source and the floating gate thereby reducing junction break-down while at the same time increasing the coupling ratio, according to this invention.

After the forming of control gates (160) and the forming of the additional poly line (165) over the source line, oxide spacers (170) are formed along the vertical walls of the control gates (160) as shown in FIG. 2G. The forming of the spacers is accomplished by depositing an oxide layer (not shown) over the substrate and anisotropically etching to a thickness between about 2000 to 5000 Å. Subsequently, drain implantation is performed by alignment to the spacers using arsenic gas at a dosage level between about $1\times10^{15}$ to $1\times10^{16}$ atoms/cm$^2$ with energy level between about 20 to 75 KeV, to form drains (120) shown in FIG. 2G.

While the invention has been particularly shown and described with reference to the preferred embodiments thereof, it will be understood by those skilled in the art that various changes in form and details may be made without departing from the spirit and scope of the invention.

What is claimed is:

1. A method of forming split-gate flash memories with improved increased coupling ratio and improved program speed comprising the steps of:
   providing a silicon substrate having a plurality of active and field areas defined;
   forming a gate oxide layer over said substrate;
   forming a first polysilicon layer over said gate oxide layer;
   forming a nitride layer over said first polysilicon layer;
   forming a first photoresist layer over said nitride layer;
   patterning said first photoresist layer to define a cell area and a floating gate;
   etching said nitride layer through said first photoresist layer and forming openings in said nitride layer reaching said first polysilicon layer;
   removing said first photoresist layer from said substrate;
   performing thermal oxidation of said first polysilicon layer exposed in said openings reaching said first polysilicon layer to form regions of poly-oxide;
   removing said nitride layer;
   etching said first polysilicon layer to form said floating gate using said regions of poly-oxide as a hard mask; then
   forming a second photoresist layer over said substrate and patterning to define source region; then
   performing ion implantation through openings in said second photoresist layer to form source region within said substrate; then
   removing said second photoresist layer;
   growing a intergate oxide layer over said first polysilicon layer;
   forming a second polysilicon layer over said intergate oxide layer;
   patterning said second polysilicon layer to form a control gate over said floating gate and an additional third polysilicon line (poly-line) continuous over said source region;
   forming oxide spacers on sidewalls of said control gate and on sidewalls of said polyline; and
   performing ion implantation to form drain regions defined by said oxide spacers.

2. The method of claim 1, wherein said forming a gate oxide layer is accomplished thermal growth at a temperature between about 850 to 950° C.

3. The method of claim 2, wherein said gate oxide layer has a thickness between about 70 to 110 angstroms (Å).

4. The method of claim 1, wherein said forming a first polysilicon layer is accomplished with a silicon source of SiH$_4$ using LPCVD at a temperature between about 550 to 620° C.

5. The method of claim 4, wherein the thickness of said nitride layer is between about 500 to 1500 Å.

6. The method of claim 1, wherein said first polysilicon layer has a thickness between about 1100 to 1200 angstroms (Å).

7. The method of claim 1, wherein said forming a nitride layer is accomplished by CVD at a temperature between about 750 to 850° C. by reacting dichlorosilane (SiCl$_2$H$_2$) with ammonia (NH$_3$).

8. The method of claim 1, wherein said first photoresist layer has a thickness between about 1 to 1.2 micrometers ($\mu$m).

9. The method of claim 1, wherein said etching said nitride layer is accomplished with an etch recipe comprising the gases of Ar, CHF$_3$, and C$_4$F$_8$.

10. The method of claim 1, wherein said removing said first photoresist layer is accomplished by oxygen plasma ashing.

11. The method of claim 1, wherein said performing thermal oxidation of said first polysilicon layer to form poly-oxide regions is accomplished by wet oxidation at a temperature between about 850 to 950° C. and said poly-oxide regions have a thickness between about 1400 to 150 Å.

12. The method of claim 1, wherein said removing said nitride layer is accomplished with a wet solution comprising H$_3$PO$_4$.

13. The method of claim 1, wherein said etching said first polysilicon layer using said poly-oxide as a hard mask is accomplished with a recipe comprising the gases BHBr, Cl$_2$, He and O$_2$.

14. The method of claim 1, wherein said second photoresist layer has a thickness between about 1.0 to 1.2 $\mu$m.

15. The method of claim 1, wherein said performing said ion implantation through openings in said second photoresist layer to form a source region within said substrate is accomplished by implanting phosphorus ions with a dosage between about $1\times10^{15}$ to $1\times10^{16}$ atoms/cm$^2$ and at an energy between about 20 to 90 KeV.

16. The method of claim 1, wherein said second photoresist layer is removed by oxygen plasma ashing.

17. The method of claim 1, wherein said intergate oxide layer has a thickness between about 200 to 300 Å.

18. The method of claim 1, wherein said forming said second polysilicon layer over said intergate oxide layer is accomplished with a silicon source of SiH$_4$ using LPCVD at a temperature between about 550 to 620° C.

19. The method of claim 1, wherein said second polysilicon layer patterned to form said control gate and said poly-line has a thickness between about 1500 to 2500 Å.

20. The method of claim 1, wherein said oxide spacers comprise silicon nitride with a thickness between about 2000 to 5000 Å.

21. The method of claim 1, wherein said performing said ion implantation to form drain regions defined by said oxide spacers is accomplished by implanting arsenic ions at a dosage level between about $1\times10^{15}$ to $1\times10^{16}$ atoms/cm$^2$ with an energy level between about 20 to 75 KeV.

* * * * *